US008833435B2

(12) United States Patent
Determan et al.

(10) Patent No.: US 8,833,435 B2
(45) Date of Patent: Sep. 16, 2014

(54) MICROSCALE COOLING APPARATUS AND METHOD

(75) Inventors: Matthew Determan, Atlanta, GA (US); Scott W. C. H. Lee, Honolulu, HI (US); Abel Manuel Siu Ho, Honolulu, HI (US); Seri Lee, Honolulu, HI (US)

(73) Assignee: Pipeline Micro, Inc., Honolulu, HI (US)

( * ) Notice: Subject to any disclaimer, the term of this patent is extended or adjusted under 35 U.S.C. 154(b) by 1245 days.

(21) Appl. No.: 12/511,945

(22) Filed: Jul. 29, 2009

(65) Prior Publication Data

US 2010/0032150 A1 Feb. 11, 2010

Related U.S. Application Data

(60) Provisional application No. 61/086,419, filed on Aug. 5, 2008, provisional application No. 61/156,465, filed on Feb. 27, 2009.

(51) Int. Cl.
| | |
|---|---|
| *F28F 27/00* | (2006.01) |
| *F28F 3/12* | (2006.01) |
| *F28D 15/02* | (2006.01) |
| *H01L 23/427* | (2006.01) |
| *F28D 21/00* | (2006.01) |

(52) U.S. Cl.
CPC ......... *F28D 15/0266* (2013.01); *F28F 2250/04* (2013.01); *F28F 3/12* (2013.01); *F28D 2021/0031* (2013.01); *F28F 2270/00* (2013.01); *H01L 23/427* (2013.01); *F28F 2260/02* (2013.01); *F28D 2021/0029* (2013.01)
USPC ......... 165/11.1; 165/166; 165/167; 165/170; 165/104.33; 165/135; 165/136; 165/80.3; 165/80.4; 165/80.5; 165/299; 165/104.25; 361/695; 361/699

(58) Field of Classification Search
CPC ................... F28D 15/0266; F28D 2021/0029; F28D 2021/0031; H01L 23/427; F28F 3/12; F28F 2270/00
USPC ........... 165/166, 167, 104.33, 170, 11.1, 135, 165/136, 80.4, 80.5, 80.3, 299, 104.25; 361/695, 699
See application file for complete search history.

(56) References Cited

U.S. PATENT DOCUMENTS 1,962,954 A * 6/1934 Gofferje .......................... 165/170
4,165,733 A * 8/1979 Middleton et al. ........... 165/11.1
(Continued)

OTHER PUBLICATIONS

PCT International Search Report and Written Opinion of the International Searching Authority, issued Sep. 22, 2009, application No. PCT/US2009/052317.

*Primary Examiner* — John Ford
(74) *Attorney, Agent, or Firm* — Ganz Law, P.C.

(57) ABSTRACT

A method and system for providing a heat sink assembly are described. The assembly includes a two-phase heat sink, a condenser, and a pump. The two-phase heat sink may include flow micro-channels that accommodate the flow of boiling coolant and cross-connect channel(s) that at least partially equilibrate a pressure field for the boiling coolant. The condenser receives coolant from the heat sink and removes heat. The pump drives coolant through the assembly. In one aspect, the assembly is a closed system for the coolant. In another aspect, the condenser includes first and second plates and a heat exchange surface there between. Coolant flows from the heat sink and through the plates. The gaseous coolant passes the heat exchange surface. In one aspect the gaseous coolant flows opposite to the direction coolant flows. In one aspect, at least one of the plates includes dummy channel(s) for insulating part of the plate(s).

18 Claims, 9 Drawing Sheets

(56) References Cited

U.S. PATENT DOCUMENTS

| | | | |
|---|---|---|---|
| 4,354,551 A * | 10/1982 | Kristoffersson et al. | 165/166 |
| 5,706,668 A * | 1/1998 | Hilpert | 62/259.2 |
| 5,720,341 A | 2/1998 | Watanabe et al. | |
| 6,973,804 B2 * | 12/2005 | Horiuchi et al. | 62/513 |
| 6,994,151 B2 | 2/2006 | Zhou et al. | |
| 7,104,312 B2 | 9/2006 | Goodson et al. | |
| 7,228,894 B2 | 6/2007 | Moore et al. | |
| 7,325,410 B1 | 2/2008 | Bean, Jr. | |
| 2002/0178746 A1 * | 12/2002 | Gupte | 62/513 |
| 2005/0126760 A1 | 6/2005 | Makino et al. | |
| 2005/0173098 A1 | 8/2005 | Connors | |
| 2006/0142401 A1 | 6/2006 | Tonkovich et al. | |
| 2007/0095087 A1 * | 5/2007 | Wilson et al. | 62/259.2 |

* cited by examiner

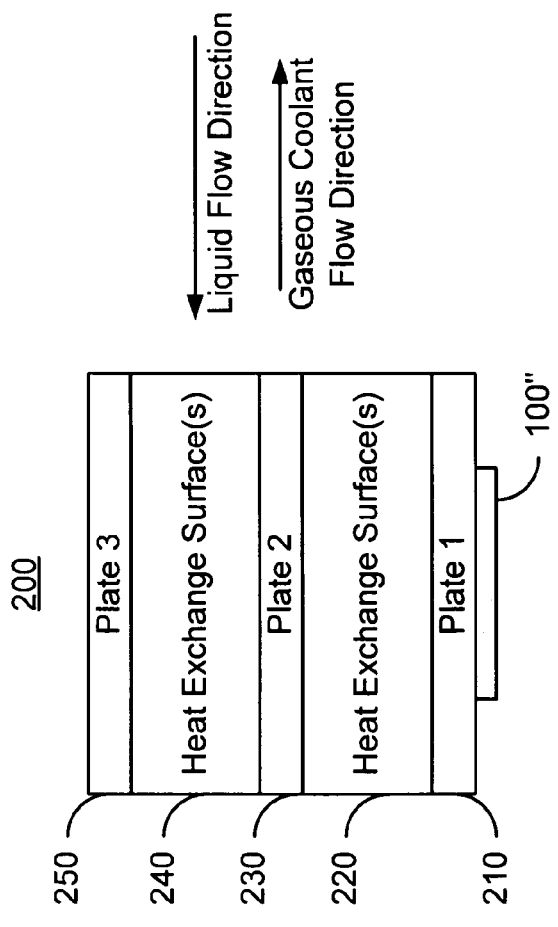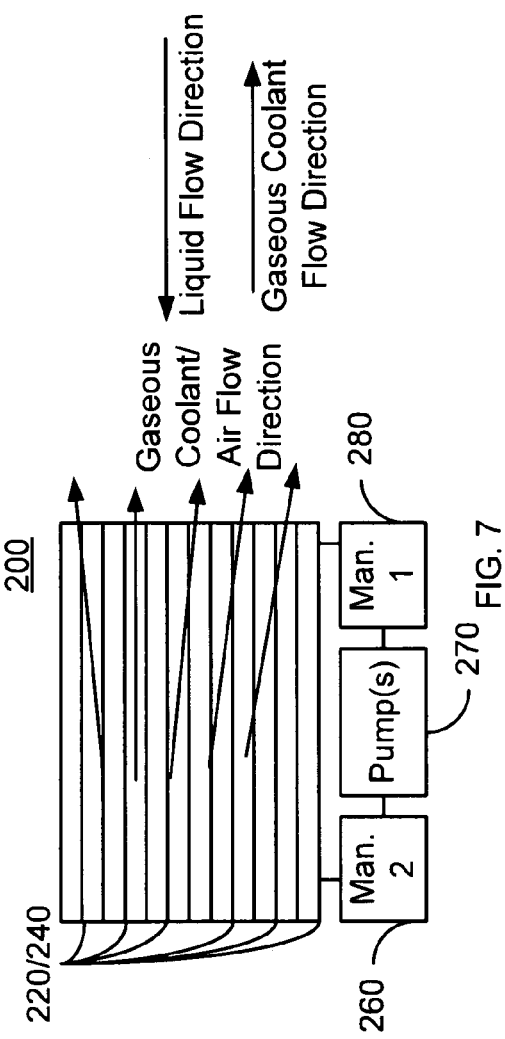

MICROSCALE COOLING APPARATUS AND METHOD

CROSS-REFERENCE TO RELATED APPLICATIONS

This application claims the benefit of provisional Patent Application Ser. No. 61/086,419, filed Aug. 5, 2008, and the benefit of provisional Patent Application Ser. No. 61/156,465, filed on Feb. 27, 2009, both assigned to the assignee of the present application, and incorporated herein by reference.

BACKGROUND

Increases in speed and performance in conjunction with a long lifetime for electronic devices are generally desired. These features drive a demand for increased power and, therefore, increased heat dissipation. A variety of conventional mechanisms for improving dissipation of heat in electronic devices have been proposed. Some of these conventional mechanisms include single-phase heat dissipation utilizing a liquid coolant. Others involve two-phase heat dissipation. In two-phase systems, energy taken up by the liquid-vapor transition provides a high degree of cooling power. In order to exploit this cooling power in electronic devices, two-phase micro-channel heat sinks have been proposed. Two-phase micro-channel heat sinks typically include micro-sized parallel channels through which a boiling liquid coolant flows. Advantages that might be provided by these two-phase micro-channel heat sinks include lower thermal resistance, a large surface-area-to-volume ratio, the possibility of a small heat sink weight and volume, a relatively small liquid coolant inventory and flow rate requirement, and relatively uniform temperature distribution in the flow direction. However, such micro-channel heat sinks are typically subject to instabilities that prevent their use in devices. In particular, the micro-channel heat sink may be subject to dryout in regions of particular channels. Areas of dryout include only vapor coolant. The dryout may cause temperature and pressure oscillations that prevent the micro-channel heat sink from operating as desired. In addition to issues with the micro-channel heat sink itself, there may be difficulties in adapting the micro-channel heat sink to use with electronic devices. The delivery of fluid, ability to maintain a flow through the micro-channel heat sink, the form factor for particular devices, and other factors may reduce the utility of two-phase micro-channel heat sinks in cooling of electronic devices.

Accordingly, what is desired is an improved method and system for cooling of devices, such as electronic devices.

BRIEF SUMMARY

The exemplary embodiment provides methods and systems for providing a heat sink assembly for cooling an electrical device. In one aspect, the heat sink includes a micro-channel heat sink, a condenser, and a pump. The micro-channel heat sink is thermally coupled with the electrical device and includes at least one inlet, at least one outlet, a plurality of flow micro-channels defined by a plurality of channels walls, and at least one cross-connect channel. The flow micro-channels connect the inlet(s) with the outlet(s) and accommodate a flow of coolant between the inlet(s) and the outlet(s). Each of the cross-connect channel(s) is configured to connect at least a portion of the flow micro-channels and at least partially equilibrate a pressure field for boiling of the coolant across the portion of the flow micro-channels. The condenser is coupled with the two-phase heat sink, receives the coolant from the micro-channel heat sink and removes heat from the coolant. The pump is coupled with the micro-channel heat sink and the condenser. The pump drives the coolant through the micro-channel heat sink and condenser. The micro-channel heat sink, the condenser, and the pump are in fluid communication. The heat sink assembly is a closed system for the coolant. In another aspect, the heat sink assembly includes a two-phase heat sink, a first plate, a second plate, a heat exchange surface between the first and second plates, and a pump. The two-phase heat sink is thermally coupled with the electrical device, is capable of supporting boiling of a flow of coolant, and might be a micro-channel heat sink. The first plate is coupled with the two-phase heat sink. The second plate is coupled with the first plate such that coolant flows from the two-phase heat sink to the first plate, through the first plate, from the first plate to the second plate and through the second plate. The pump is coupled with the two-phase heat sink, the first plate, and the second plate, the pump. The pump drives the coolant through the two-phase heat sink, the first plate, and the second plate. A gaseous coolant is driven past the heat exchange surface substantially in a first direction. The coolant flows through the first plate and the second plate in a second direction substantially opposite to the first direction. In another aspect, the heat sink assembly includes a two-phase heat sink, a first plate, a second plate, a heat exchange surface between the first and second plates, and a pump. The two-phase heat sink is thermally coupled with the electrical device and is capable of supporting boiling of a flow of coolant. The first plate is coupled with the two-phase heat sink. The second plate is coupled with the first plate such that coolant flows from the two-phase heat sink to the first plate, through the first plate, from the first plate to the second plate and through the second plate. The pump is coupled with the two-phase heat sink, the first plate, and the second plate, the pump. The pump drives the coolant through the two-phase heat sink, the first plate, and the second plate. A gaseous coolant passes the heat exchange surface. At least one of the first plate and the second plate includes at least one inlet, at least one outlet, at least one channel between the at least one inlet and the at least one outlet, and at least one dummy channel. The channel(s) carry the coolant through the at least one of the first plate and the second plate. The at least one dummy channel insulates a portion of the at least one of the first plate and the second plate from a portion of heat carried by the coolant

BRIEF DESCRIPTION OF SEVERAL VIEWS OF THE DRAWINGS

FIGS. 6-7 are block diagrams of an exemplary embodiment of a heat sink assembly that may be used with a two-phase micro-channel heat sink.

DETAILED DESCRIPTION

The exemplary embodiments relate to micro-channel heat sinks and heat sink assemblies that might be used with two-phase heat sinks, such as micro-channel heat sinks. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

A heat sink assembly is described. The heat sink assembly may be used in connection with a two-phase heat sink. A two-phase heat sink utilizes a coolant that may transition between two phases—liquid and gas—during use. For example, the heat sink assembly may utilize a micro-channel heat sink to cool electrical component(s). Such a micro-channel heat sink includes inlet(s), outlet(s), flow micro-channels, and at least one cross-connect channel. The flow micro-channels are defined by a plurality of channels walls, connect the inlet(s) with the outlet(s) and accommodate a flow of coolant between the inlet(s) and the outlet(s). The coolant may boil as the coolant traverses the flow micro-channels. The cross-connect channel(s) are configured to connect at least a portion of the flow micro-channels. The cross-connect channel(s) also at least partially equilibrate a pressure field for boiling of the coolant across the portion of the flow micro-channels.

Figure 1:
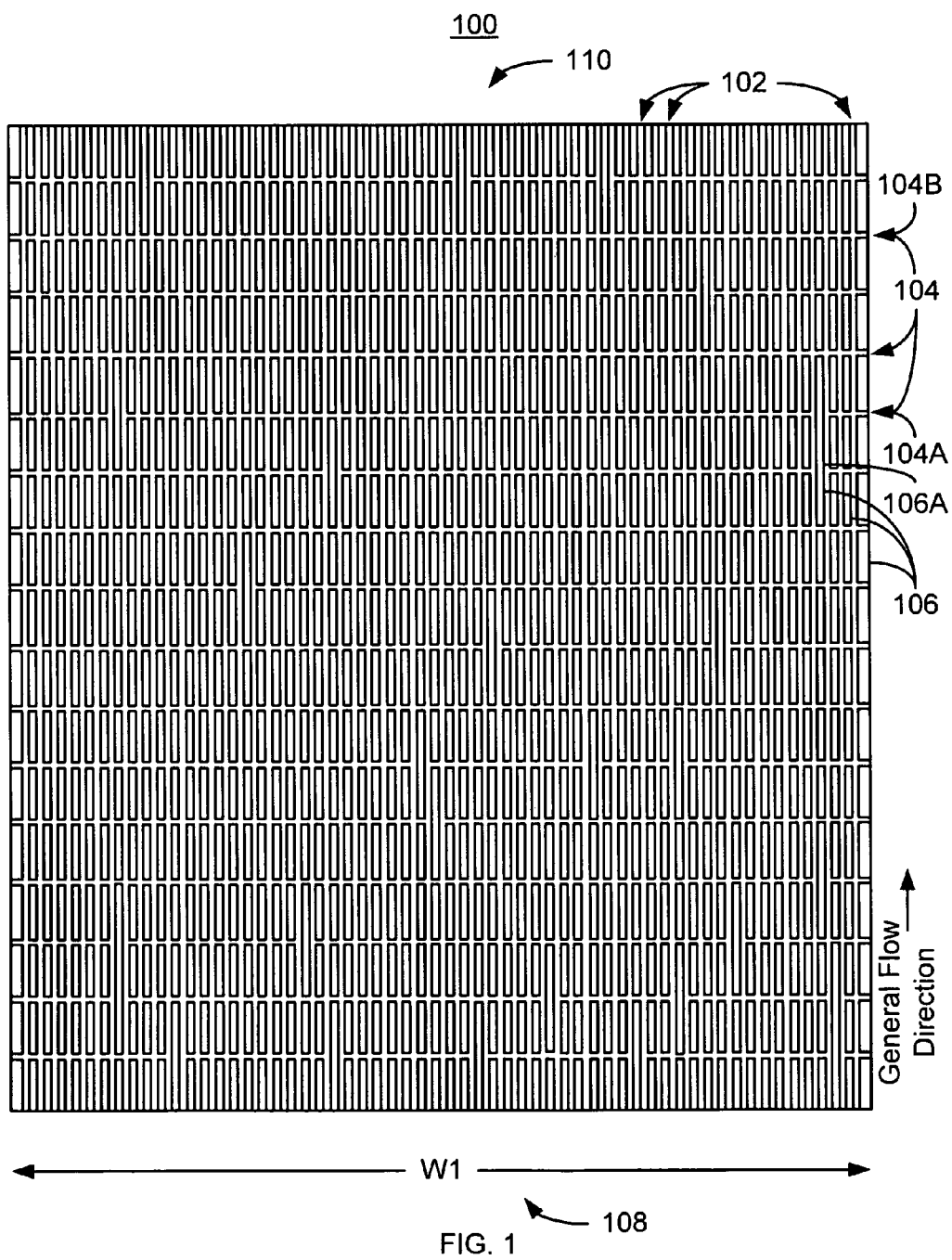
FIGS. 1-3 are diagrams of an exemplary embodiment of a micro-channel heat sink that may be used in conjunction with the method and system.
Figure 2:
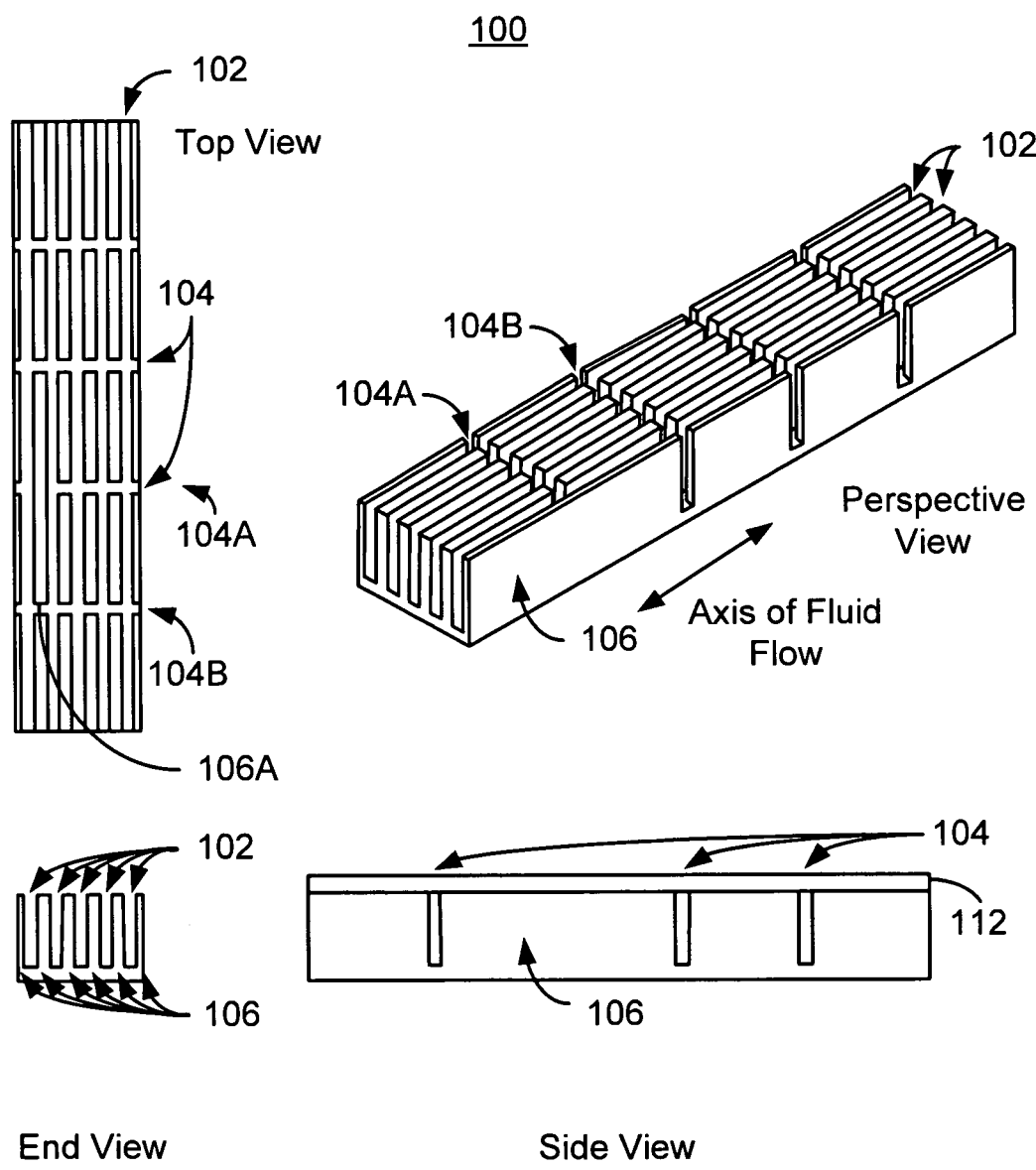
Figure 3:
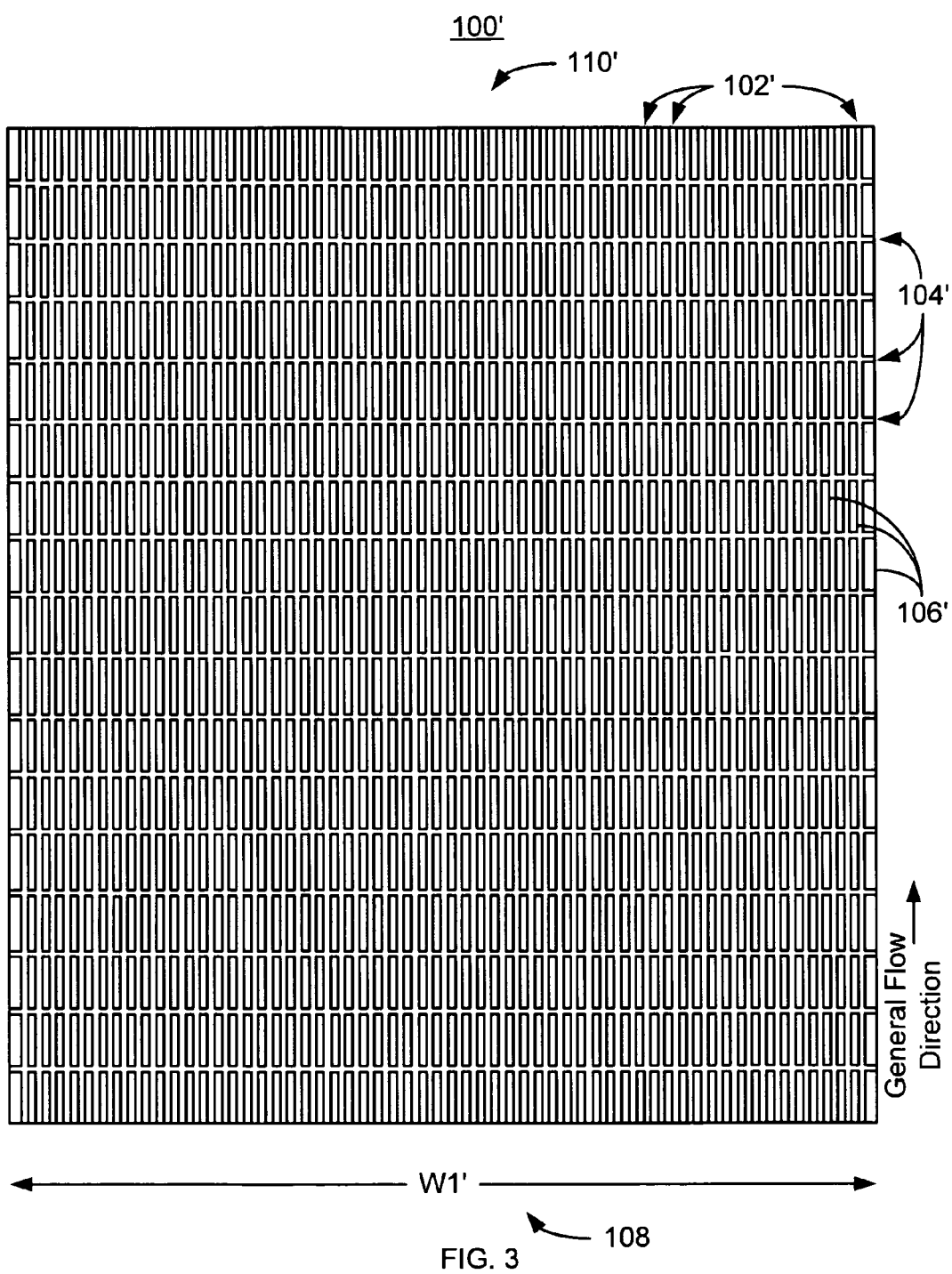

FIGS. 1-3 depict embodiments of a two-phase micro-channel heat sink that might be used in a heat sink assembly. FIG. 1 depicts a plan view of an exemplary embodiment of a two-phase micro-channel heat sink 100. FIG. 2 depicts perspective, side, and plan views of a portion of the exemplary embodiment of a two-phase micro-channel heat sink 100. Note that FIGS. 1-2 are not drawn to scale. Referring to FIGS. 1-2, the heat sink 100 includes flow micro-channels 102, cross-connect channels 104, channel walls 106, inlet 108, and outlet 110. The heat sink 100 may also include a plate 112, depicted in a portion of FIG. 2. For clarity, not all flow micro-channels 102, cross-connect channels 104, and channel walls 108 are labeled. Further, another number of flow micro-channels 102 and/or another number of cross-connect channels 104 may be used.

The portions of the heat sink 100 may be fabricated separately and coupled together or, more generally, formed from a single substrate. The substrate for the base of the heat sink 100 is generally fabricated from one or more high thermal conductivity solid materials, such as copper or silicon. The flow micro-channels 102, as well as the cross-connect channels, 104 may be formed in the substrate by techniques such as micro-machining, milling or some other mechanism that removes material from a substrate. However, the flow micro-channels 102, cross-connect channels 104 and channel walls 106 may be formed in another manner. The top 112 may be fabricated separately from the remaining portions of the heat sink 100, then coupled with the remaining portions to enclose the micro-channels 102 and cross-connects 104, except for the inlet 108 and outlet 110. For example, the top 112 may be diffusion bonded, attached with an adhesive or otherwise affixed to the remaining portions 102/104/106 of the heat sink 100.

During operation, the heat sink 100 is attached to a heat-dissipating device (not shown in FIGS. 1-3), such as an electronic device. Heat generated by the device(s) may be transferred to the heat sink 100, then to a coolant (not shown) flowing through the heat sink. The coolant flows generally from the inlet 108 to the outlet 110. The flow of coolant through the heat sink 100 dissipates the heat from the heat sink 100 and thus from the device(s) being cooled.

The micro-channel heat sink 100 is a two-phase heat sink. Although termed a two-phase heat sink, the micro-channel heat sink 100 may operate in a single-phase or a two-phase mode. For a relatively high coolant flow rate and/or a relatively low dissipative heat flux, the coolant passing through the heat sink may maintain its liquid single-phase state throughout the heat sink 100. In such a situation, the micro-channel heat sink 100 operates as a single-phase heat sink. If the coolant flow rate is sufficiently low and/or the heat flux to be dissipated is sufficiently large, the liquid coolant may reach its boiling point while still flowing through the heat sink 100, and flow boiling occurs. This results in the heat sink 100 operating as a two-phase heat sink. During operation in such a two-phase mode, the latent heat exchange associated with transition of the coolant from liquid to vapor may more efficiently remove heat from the two-phase micro-channel heat sink.

The micro-channels 102 are configured to carry a boiling fluid in the longitudinal direction. Boiling liquid coolant(s) such as water and/or dielectric fluorochemical coolants may be carried through the micro-channels 102. However, other embodiments, other fluids might be used. For example, Novec™, R134a, R22, and/or other refrigerants, including high pressure refrigerants, might be used. The fluid selected may depend upon, among other factors, the pump (not shown) selected for use. In addition, a refrigerant that may be used at greater than atmospheric pressure and that has a boiling point within the operating temperature range of the device may be desired. For example, a fluid having a boiling point of less than eighty-five degrees centigrade might be used. In one such embodiment, the fluid may have a boiling point of at least forty and not more than forty-five degrees centigrade. Such a fluid may be more likely to boil when cooling a device within the device's operating parameters. A fluid having a greater than atmospheric pressure is desired to minimize leakage into a system that uses the heat sink 100. Thus, selection of the coolant for use in connection with the heat sink 100 may vary.

In the embodiment shown, the flow micro-channels 102 are a series of parallel, symmetric, rectangular cross-section micro-slots, or depression, formed in a base. The flow micro-channels 102 have a width and are defined by channel walls 106, which also have a width and height. The flow micro-channels 102 may be no larger than in the microscale regime.

For example, flow micro-channels may range from ten to one thousand microns in width for certain embodiments. Smaller widths may also be possible. The channel walls 106 may have a thickness in the one hundred micron range, a height in the hundreds of microns range. However, other channel cross-sections, widths, heights, channel directions are possible for the flow micro-channels 102. In some embodiments, the flow micro-channels may not be parallel, linear, symmetric, and/or rectangular. Similarly, in some embodiments, the flow micro-channels may have varying widths. For example, a particular flow micro-channel may have a width that changes along the length of the flow micro-channel. In addition, one flow micro-channel 102 may not have the same width as another flow micro-channel 102. Further, in other embodiments, the flow micro-channels might not be parallel, might be curved, and/or might be not be perpendicular to the direction between the inlet and outlet. The flow micro-channels 102 may be closed using the cover plate 112. The inlet 108 and outlet 110 correspond to plenums at inlet and outlet ends of the two-phase micro-channel heat sink 100. The inlet 108 and outlet 110 are used to introduce coolant to and discharge coolant from the flow micro-channels 102, respectively. Thus, coolant flows along the flow micro-channels 102 from the inlet 108 to the outlet 110. Stated differently, the flow micro-channels 102 are configured to carry the coolant, which may exist in one or two-phases, between the inlet 108 and outlet 110.

The two-phase micro-channel heat sink 100 also includes cross-connect channels 104. In the embodiment shown, the cross-connect channels 104 are micro-channels. In such an embodiment, the cross-connect channels 104 may be no larger than in the microscale regime. For example, in some embodiments, the cross-connect channels 104 may have a width in the range of ten to one thousand microns. Smaller widths may also be possible. Although shown as having the same width and being of rectangular cross-section, other channel cross-sections, widths, heights, and channel directions are possible for the cross-connect micro-channels 104. In some embodiments, the cross-connect may not be parallel, linear, symmetric, and/or rectangular. Similarly, some embodiments, the cross-connect channels 104 may have varying widths. For example, a particular cross-connect channel may have a width that changes along the length of the cross-connect channel. In addition, one cross-connect channel 104 may not have the same width as another cross-connect channel 104. The cross-connect channels 104 may be closed using the cover plate 112.

The coolant flows generally from the inlet 108 to the outlet 110. In the embodiment shown, the cross-connect channels 104 are substantially perpendicular to the local direction of flow. This is in contrast to the flow micro-channels 102. The cross-connect channels 104 thus extend substantially transverse to the flow direction and, in the embodiment shown, to the direction of the flow micro-channels 102. Some cross-connect channels 104, such as the channel 104A, do not extend across the entire width, W1, of the two-phase micro-channel heat sink 100. Such cross connect channels 104A do not cross all of the flow micro-channels 102. Other cross-connect channels 104, such as the channel 104B, do extend across the entire width of the two-phase micro-channel heat sink 100. Such cross-connect channels 104B cross all of the flow micro-channels 102. In some embodiments, all cross-connect channels 104 may extend across the entire width of the two-phase micro-channel heat sink. Such an embodiment 100' is depicted in FIG. 3. Thus, the components 102', 104', 106', 108' and 110' of the heat sink 100' are analogous to the components 102, 104, 106, 108, and 110, respectively, of the heat sink 100'. In general, the heat sink 100' is analogous to the heat sink 100 except that the cross-connect channels 104' extend cross the heat sink 100'. Consequently, the heat sinks 100 and 100' and their components are described in connection with the heat sink 100. In other embodiments, none of the cross-connect channels extend across the width of the two-phase micro-channel heat sink. In the embodiments shown, the cross-connect channels 104' occur at regular intervals. Thus, the cross-connect channels 104 are uniformly spaced along the flow direction. For example, in one embodiment, the cross-connect channels 104 occur at one millimeter intervals. However, in another embodiment, the cross-connect channels 104 need not be uniformly spaced and/or may occur at intervals having other distances.

The cross-connect channels 104 may be used to at least partially equilibrate a pressure field for boiling of the coolant across the portion of the plurality of flow micro-channels. The cross-connect channels 104 allow for vapor and/or liquid communication between flow micro-channels 104. When the two-phase micro-channel heat sink 100/100' operates in a two-phase mode, the pressure of the boiling coolant may equilibrate along the length of each cross-connect channel 104. Stated differently, the pressure may be uniform along each cross-connect channel 104. As a result, the pressure of the coolant flowing through the flow micro-channels 102 is equilibrated across at least a portion of the width, W1, of the two-phase micro-channel heat sink 100/100'. For a cross-connect channel, such as the channel 104A, the pressure of the boiling coolant is equilibrated across only a part of the width of the two-phase micro-channel heat sink 100. Thus, a cross-connect channel 104 on the other side of a channel wall 106 may have a different pressure. For example, the cross-connect channel 104A may have one pressure, while the channel (not labeled) on the other side of the channel wall 106A from the cross-connect channel 104A may have a different pressure. For a cross-connect channel 104, such as the channel 104B, the pressure of the boiling coolant may equilibrate across the entire width of the two-phase micro-channel heat sink 100. Consequently, the cross-connect channels 104 correspond to regions of uniform pressure across multiple flow micro-channels 102. As a result, the pressure of coolant traversing the flow micro-channels 102 may vary more uniformly between the inlet 108 and the outlet 110. Consequently, pressure oscillations may be reduced.

As discussed above, the cross-connect channels 104 may occur at various intervals and are used to equilibrate pressure along their length. The location, length, and other features of the cross-connect channels 104 might vary based upon the implementation. In some embodiments, cross-connect channels 104 may be located at larger intervals as long as the cross-connect channels 104 are sufficiently close that severe pressure oscillations are reduced or eliminated in the operating range of the heat sink 100. In other embodiments, the cross-connect channels 104 may be more closely spaced. However, in such embodiments, it is desirable to locate the cross-connect channels 104 sufficiently far apart that a satisfactory flow of coolant through the flow micro-channels 102 is also maintained.

The size, spacing, aspect ratio and other features of the micro-channels 102 and cross-connects 104 may be the same as those described above. However, the configuration of the micro-channels 102 and cross-connects 104 may be altered. For example, in one embodiment, the aspect ratio or other features of the micro-channels 102 and/or the cross-connects 104 may be changed. In some embodiments, the channel width may be increased. However, when scaling the heat sink 100 up, the aspect ratio of the channels may be changed. As discussed above, a channel width of one hundred microns and height of six hundred microns might be used for the heat sink 100. However, a heat sink 100 having a channel 102 width of one hundred and fifty microns may have a channel 102 height of one thousand microns or more. Consequently, the aspect ratio of the micro-channels 102 may differ in the heat sink 100/100'. Such a heat sink 100/100' may have improved manufacturability. In particular, a heat sink 100 having wider channels 102 may be simpler to fabricate. For an embodiment having a channel height of at least one thousand microns, this improvement in manufacturability may be achieved without adversely affecting flow characteristics and cooling power of the heat sink 100/100'. In particular, it is believed that an increase in the height of the micro-channels 102 greater than indicated by original aspect ratio may maintain the flow characteristics of the heat sink 100/100'. In particular, the pressure equalization, prevention of dryout in individual channels, and cooling power may be maintained. Consequently, performance of the heat sink 100/100' may be improved.

Moreover, the heat sink 100/100' may include additional materials other than those described above. The heat sink is desired to be made with materials having a relatively high conductivity. In addition to materials such as Cu and Si, other materials such as diamond may be used. A material having directional thermal conductivity might also be used. Such a material has a lower thermal conductivity in one direction, but higher thermal conductivity in another direction. For example, materials such as eGRAF® of GrafTech, International might be used. eGRAF™ has a thermal conductivity that is high in two dimensions (across a plane), but low perpendicular to the plane. eGRAF™ is typically utilized to spread heat across the plane of a heat shield while maintaining a low temperature perpendicular to the plane of the heat shield. A material such as eGRAF™ may be used for the heat sink 100. However, the material may be used to provide a high thermal conductivity perpendicular to the base of the heat sink 100. Stated differently, the heat sink 100/100' would have a high thermal conductivity perpendicular to the base (vertically in the end and side views of FIG. 2). In such an embodiment, the heat sink 100/100' may have improved ability to transfer heat through surfaces in contact with the coolant. As a result, the heat sink 100/100' may be better able to transfer heat to the cooling fluid passing through the micro-channels 102. Consequently, efficiency of the heat sink 100/100' may be improved.

The two-phase micro-channel heat sink 100/100' may be used to achieve a variety of benefits. High efficiency cooling may be accomplished because the latent heat of the liquid-to-vapor phase transition may be used to provide enhanced heat transfer. Furthermore, the combination of the flow micro-channels 102 and cross-connect channels 104 allow for reduced pressure oscillations and stable flow of the boiling liquid coolant. These attributes may enable the two-phase micro-channel heat sink 100/100' to stably and repeatably dissipate high heat fluxes, particularly from small areas. The two-phase micro-channel heat sink 100/100' may also have low thermal resistance to heat dissipation, large surface-area-to-volume ratio, small heat sink weight and volume, small liquid coolant inventory, and a smaller flow rate requirement. A more uniform temperature variation in the flow direction and higher convective heat transfer coefficients may also be achieved. Consequently the two-phase micro-channel heat sink 100/100' may be suitable for thermal management of high-power-density electronic devices including but not limited to devices such as high-performance microprocessors, laser diode arrays, high-power components in radar systems, switching components in power electronics, x-ray monochromator crystals, avionics power modules, and spacecraft power components.

Figure 4:
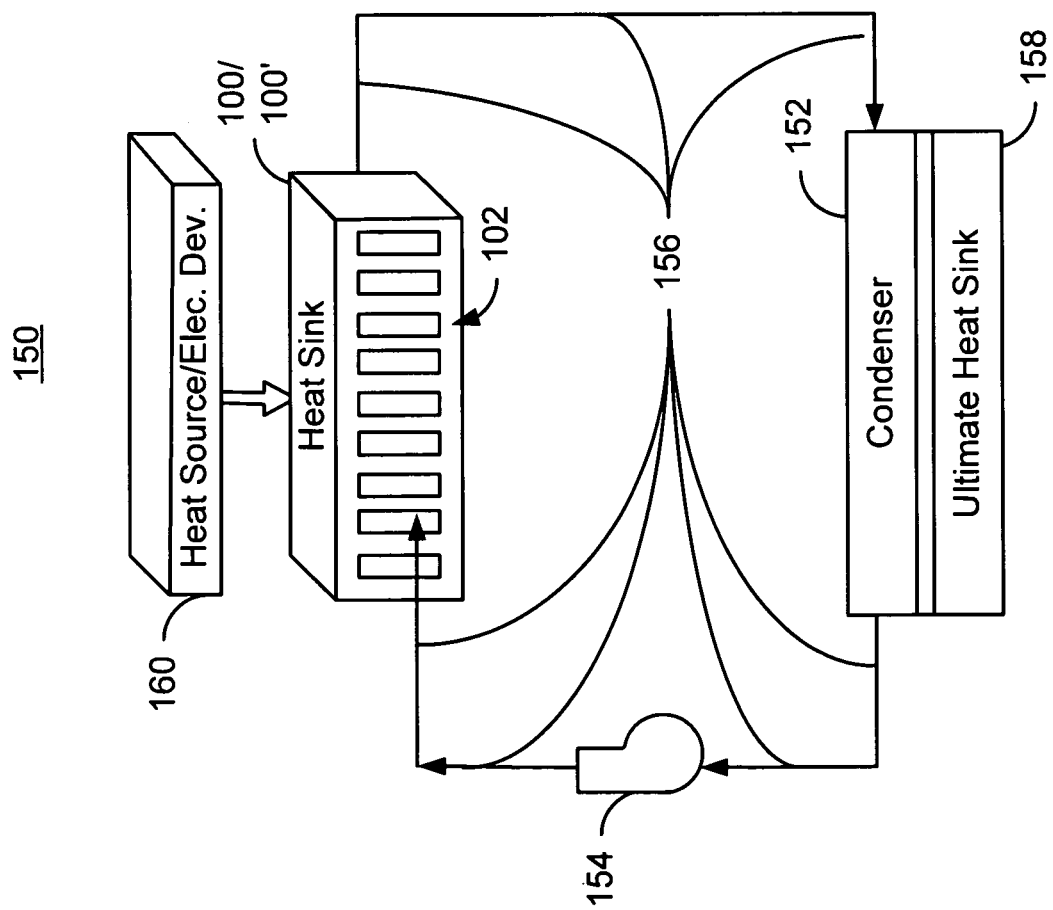
FIG. 4 depicts an exemplary embodiment of a closed cooling system utilizing the two-phase micro-channel heat sink.

In addition to improvements in the heat sink 100/100', use of the heat sink 100/100' may also be enhanced. In particular, the heat sink 100 may be used in a closed cooling system. FIG. 4 depicts an exemplary embodiment of a closed cooling system 150 utilizing the two-phase micro-channel heat sink 100/100'. For clarity, FIG. 4 is not drawn to scale and components may be omitted or combined with other components. The cooling system 150 is used to cool heat source 160. The heat source 160 may be an electronic or other device desired to be cooled using the system 150. The system 150 is deemed a closed system because the fluid/coolant is desired to remain within the system 150, without requiring additional fluid to be injected into the system 150 during operation. Note that as used herein, the terms "fluid" and "coolant" are interchangeable.

The cooling system 150 includes an embodiment of the heat sink 100/100' including micro-channels 102 and cross-connects (not shown in FIG. 4), condenser 152, pump 154, and connections 156. Note that the relative positions of the components 100/100', 152, 154, 156, and device 160 is for illustration only and not intended to convey physical positions during use. Ultimate heat sink 158 may optionally be used to cool the condenser 152. Alternatively, another mechanism may be used to remove heat through the condenser 152. Although not shown in FIG. 4, in some embodiments an expansion bladder or other mechanism to account for changes in fluid volume may be used. Although only a single heat sink 100/100' is shown, multiple heat sinks 100/100' may be utilized. Similarly, multiple pumps 154, condensers 152, and/or ultimate heat sinks 158 might be used. Further, the pump 154 and heat sink 100/100' are shown separately. In another embodiment, the pump 154 and heat sink 100/100' may be integrated into a single package. For example, a diaphragm, piezoelectric or other similar pump 154 may be used in connection with a heat sink 100/100' formed in Si or from another material. If the heat sink 100/100' and other portions of the system 150 are incorporated into a small, single package, then the connections 156 or other components may be part of the same package. Although depicted as spaced apart, the heat source 160 is generally in close physical proximity, for example in physical contact with, the heat sink 100/100'. Consequently, heat may be transferred from the heat source 160 to the heat sink 100/100', preferably via conduction.

Prior to use, the system 150 is assembled, charged and sealed. In particular, the fluid is loaded into the system 150, and then the system is sealed shut. In one embodiment, charging of the system may take place in a vacuum chamber. In such an embodiment, the system 150 may be placed in the chamber (not shown) and the fluid injected. In one embodiment, the connections 156, particularly those used to charge the system 150, are copper tubes or analogous components. The connection 156 used to charge the fluid of the system may then simply be clamped or pinched off. Alternatively diffusion bonding may be used to clamp the connections 156 or otherwise bond components of the system 150. Diffusion bonding uses a combination of pressure and heating of the components in order to bond the components. Once charging is complete, the system 150 is designed such that fluid does not enter or leave the system 150. Instead, the coolant circulates through the components 100/100', 152, and 154 of the system 150. In the embodiment shown, fluid circulation is in the direction of the arrows.

In operation, the heat source 160 may be placed in physical contact with the heat sink 100/100'. The heat sink 100/100' transfers heat from the heat source 160 to the fluid, which circulates through the system 150. In particular, heat is transferred from the walls of the channels 102 to the fluid traveling through the heat sink 100/100'. This heat transfer may cause the coolant to boil. As a result, at least while in the heat sink 100/100', the coolant may exist in two phases. Hence, the heat sink 100/100' is a two-phase heat sink.

The connections 156 transfer the fluid between the components 100/100', 152, and 154 of the system 150. The heated and, in some cases, boiling fluid is carried from the heat sink 100/100' to the condenser 152. The specifics of the connections 156 may depend upon the application for which the system 150 is used. For example, the connections 156 may include hoses, metal tubes, trenches formed in a semiconductor, manifolds or other devices, and/or other delivery systems depending upon the form factor, connection to the heat source 160 or other parameters in which the system 150 is desired to function.

The condenser 152 removes heat from the fluid. The coolant thus transfers heat originally from the heat source 160 to the condenser 152. The heat is then transferred from the condenser 152 to the ultimate heat sink 158 or otherwise removed from the system 150. In one embodiment, the condenser 152 may include two or more plates having heat exchange surfaces, such as fins, between the plates as well as a mechanism for driving a coolant past the plates. For example if a gaseous coolant is used, a blower may drive the gaseous coolant past the plates. In other embodiments, the condenser 152 could include other components and/or be differently configured. The coolant from the heat sink 100/100' circulates through the plates. Heat from the coolant is transferred to the plates and thus the heat exchange surface. The gaseous coolant, such as air, is driven past the fins. Heat from the fins is thus transferred to and removed by the gaseous coolant. Details of such a heat exchanger are described below.

Upon leaving the condenser 152, the coolant may exist in a single phase, i.e. liquid. Connections 156 transfer the fluid from the condenser 152 to the pump 154, which drives the fluid through the system 150. The pump 154 thus pumps the coolant back to the heat sink 100/100' and the cycle repeats. The closed system 150 is used to provide two-phase cooling using the heat sink 100/100'.

Thus, two-phase cooling may be provided in a closed system using the heat sink 100/100'. Because of the configuration of the heat sink 100/100', this may be accomplished without the system 150 being subject to large pressure oscillations and dryout of individual micro-channels 102 in the heat sink 100/100'. For example, in some embodiments, the fluid driven through the system 150, particularly the heat sink 100/100', may have fifty to sixty percent vapor or more without dryout being observed in individual channels. Because the heat sink 100/100' is a micro-channel heat sink, the footprint of the heat sink 100/100' may be small. For example, in one embodiment, the heat sink 100/100' is ½-¾ inch in width and 1-1¼ inch in length. Further, in some embodiments, the heat sink 100/100' may be provided directly on chip with the heat source 160. Further reductions in size may thus be achieved. Because two-phase cooling is used, the flow rate of coolant through the heat sink 100/100' may also be relatively low. As a result, the pump 154 may provide a low flow rate. At the same time, the pump 154 provides sufficient back pressure to drive the fluid throughout the system 150.

In addition, the condenser 152 may also be configured for a lower flow rate. As a result, the condenser 152 may include a single, longer length of tubing within the condenser 152 in lieu of multiple tubes in parallel. Consequently, balancing of fluid flow between multiple tubes in parallel may be avoided. Alternatively, the condenser 152 may be formed in another manner, such as parallel plates having a heat exchange surface there between. The condenser 152 may still remain relatively small. Further, if the pump 154 and heat sink 100/100' are integrated, a smaller length of connections 156 may be used. As a result, a smaller volume of cooling fluid may also be used. Moreover, use of the two-phase system allows for natural feedback. As the ambient temperature of the system rises, the pressure also increases. This increases the saturation temperature of the coolant. Thus, the system 150 self modulates. Further, use of a closed system allows the use of make-up fluid, a separate expansion tank, and/or an air separator and venting to be avoided, if desired. Thus, the system 150 may provide improved cooling with a smaller footprint, simpler condensers 152, less fluid, natural feedback and/or other advantages described herein.

Figure 5:
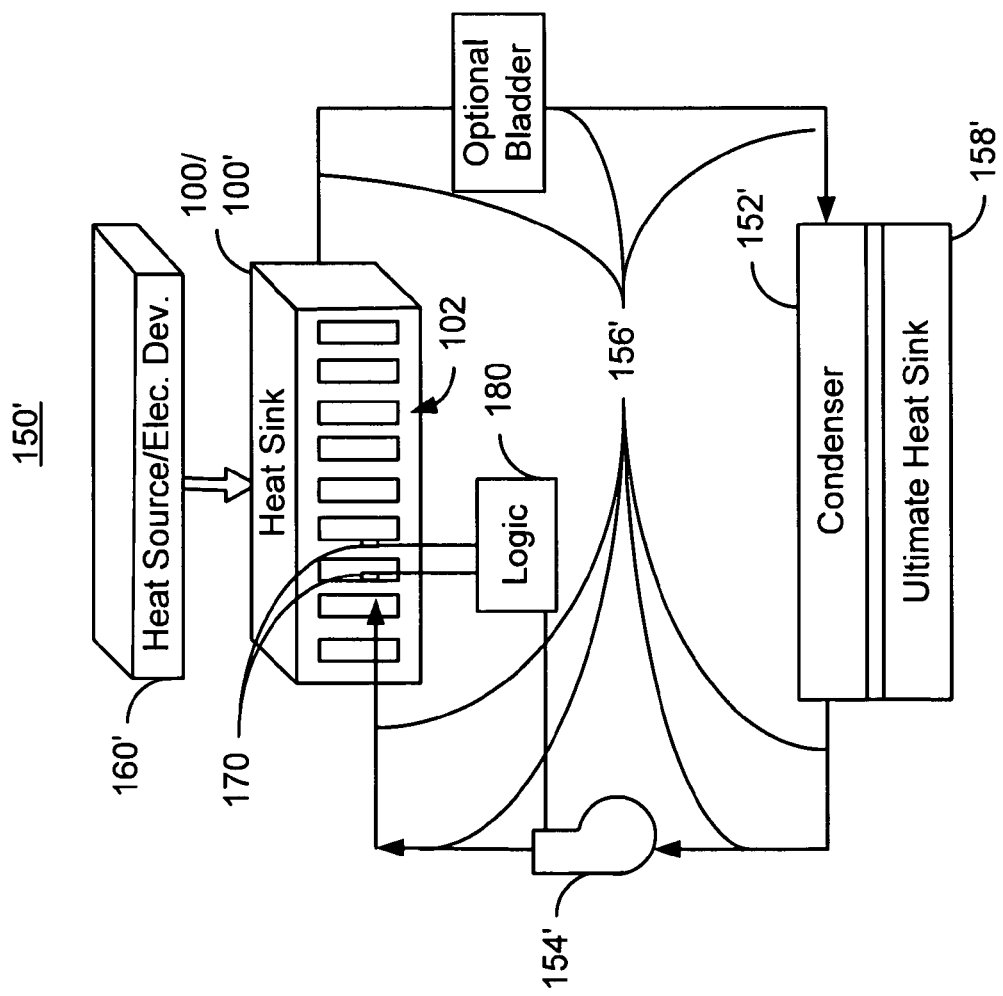
FIG. 5 depicts another exemplary embodiment of a closed cooling system utilizing the two-phase micro-channel heat sink.

FIG. 5 depicts another exemplary embodiment of a closed cooling system 150' utilizing the two-phase micro-channel heat sink 100/100'. For clarity, FIG. 5 is not drawn to scale. Components of the system 150' analogous to the system 150 are labeled similarly. Thus, the system 150' includes condenser 152', pump 154', connections 156', heat sink 100/100', optional ultimate heat sink 158', and heat source 160'. In addition, sensors 170 and control logic 180 are shown. The sensors 170 shown are desired to reside in the heat sink 100/100'. In particular, the sensors 170 reside in the channels 102. Although shown in two channels 102, the sensors 170 may be placed in more or fewer of the channels 102. The sensors 170 may be used to determine whether the corresponding channel 102 is starting to dry out. Thus, the sensors 170 may include pressure transducers and/or temperature sensors. For example, the sensors 170 may be used to determine whether the local temperature of the heat sink 100/100' is rising or whether the pressure is changing. In one embodiment, the control logic 180 may make changes to the flow through the system 150' based upon the data provided by the sensors 170. In particular, the control logic 180 may increase or decrease the flow of fluid through the system 150'. For example, if the sensors 170 indicate that the local temperature is rising and/or the corresponding channel 102 is drying out, then the control logic 180 may cause the pump 154' to increase the rate of fluid flow through the system 150'. In another embodiment, the sensors 170 may be located elsewhere. For example, sensors on the heat source 160' or other regions and/or other parameters may be used to control flow through the system 150'. Consequently, in addition to the advantages of the system 150, the system 150' may exhibit improved control over cooling of the heat source 160' and management of the system 150'.

FIGS. 6-7 are top and side views of another exemplary embodiment of a heat sink assembly 200 that may be used with a two-phase micro-channel heat sink 100". For clarity, FIGS. 6-7 are not to scale. In some embodiments, some components of the heat sink assembly 200 may be combined or omitted. In addition, other components (not shown) may be provided. In some embodiments, the heat sink assembly 200 may take the place of the condenser 152/152', pump 154/154', connections 156/156' and or ultimate heat sink 158/158' depicted in FIGS. 4-5. In addition, for clarity, the electronic device to which the two-phase heat sink 100" may be thermally connected is not shown. In some embodiments, the two-phase heat sink 100" includes one or more of the heat sinks 100 and 100'. Thus, the heat sink 100" may include cross-connect channels in addition to flow micro-channels described above. The two-phase heat sink 100' may thus operate as a single-phase (i.e. liquid) heat sink or as two-phase heat sinks, as described above.

The heat sink assembly 200 includes plates 210, 230, and 250, heat exchange surfaces 220 and 240, pump 270, and manifolds 260 and 280. In some embodiments, portions of the heat sink assembly may be repeated. For example, in some embodiments, multiple sets of plates 210/230/250 and heat exchange surfaces 220/240 may be used in connection with a single pump 270. For simplicity, one pump 270 and two manifolds 260 and 280 are shown. However, in other embodiments, another number of pumps, manifolds and/or components might be used. In the embodiment shown, the plates 210, 230, and 250, are the same. Similarly, the heat exchange surfaces 220 and 240 are shown as the same. However, in some embodiments, portions or all of the heat sink assembly 200 may differ. For example, the plate 210 may be larger than the plate 230 or 250. In addition, although only one two-phase heat sink 100" is shown, multiple two-phase heat sinks may be used. Further, although three plates 210, 230, and 250 and two heat exchanges surfaces 220 and 240 are shown, another more or fewer may be used. For example, two plates 210 and 230 and heat exchange surface(s) 220 might be used. In the embodiment shown, the heat exchange surfaces 220 and 240 each includes multiple fins, as shown in FIG. 7 that reside between plates 210 and 230 and 230 and 250, respectively. However, in another embodiment, another number of plates which may, or may not, utilize the same configuration and/or number of fins might also be employed. The heat sink assembly 200 may be coupled with electrical component(s) desired to be cooled. Such electrical components are not shown in FIGS. 6-7. For example, in some embodiments, the heat sink assembly 200 might be used to cool a graphics card and/or other high power dissipation electronics device.

Heat is exchanged from the device being cooled to the two-phase heat sink 100". Heat from the two-phase heat sink 100" is exchanged with the plates 210, 230, and 250. Heat from top plates 210, 230, and 250 is also provided to the gaseous coolant stream, shown generally by the arrows in FIGS. 6-7, through the use of the heat exchanges surfaces 220 and 240, which are shown as with internal cooling passages (i.e. fins) between the cooling plates 210 and 230 and 230 and 250. The gaseous coolant stream, for example an air stream, might be generated in a number of ways. Further, the arrows depicting the flow of gaseous coolant and liquid flow are meant to show general directions of flow and are for exemplary purposes only. Thus, heat from the component being cooled may be removed from the system.

In general, fluid that may be saturated enters the two-phase heat sink 100". In one embodiment, fluid, or coolant, flows from the pump 270, through the manifold 280 to the bottom plate 210, then to the micro-channel heat sink 100'. As used herein, the term "fluid" or "coolant" may include a single phase fluid (e.g. cooled fluid prior to entering a two-phase heat sink 100") as well as a two-phase fluid-gas combination (e.g. after heat exchange in the two-phase heat sink 100" has caused some portion of the fluid to boil). If the heat sink 100 or 100' are used, the fluid flows through the micro sized passages in the heat sink 100" and absorbs heat. The fluid may change phase (boiling) if sufficient heat is exchanged and/or a sufficiently low flow is used. The two-phase fluid exits the two-phase heat sink 100" and goes into the bottom cooling plate 210. In the bottom plate 210, one or more fluid channels are arranged in a pattern, such as a serpentine pattern. However, in other embodiments, other patterns may be used. In one embodiment, the flow through plate 210 is generally in the liquid flow direction shown. The channels may cover the area of the bottom plate 210. This allows the hot fluid to spread the heat over the area of the bottom plate 210. In one embodiment, heat may be spread substantially over the entire bottom plate 210, creating a larger platform area than the die (two-phase heat sink 100") size to transfer heat to the air. The heat conducts up into the air heat exchange surfaces 220, then to the gaseous flowing through the assembly 200. In one embodiment, the gaseous coolant driven through the fins 220/240 is air. Note that in another embodiment, a coolant other than a gaseous coolant might be used. For example, in one embodiment, a liquid or other coolant might be used in lieu of a gaseous coolant. However, the coolant flowing through the heat exchange surfaces 220/240 is separate from the fluid flowing through the two-phase heat sink 100". From the bottom plate 210, the fluid travels to the middle cooling plate 230. In one embodiment, fluid travels from the bottom plate 210 to the middle plate 230 via the manifold 280. Fluid may traverse channel(s) in the middle plate 230 in an analogous manner. Heat may be spread in an analogous manner to the bottom plate 210. In addition, heat may be transferred from the plate 230 to heat exchange surfaces 220 and 240 on both sides of the plate 230. Fluid then travels to the top cooling plate 250. In one embodiment, fluid travels from the middle plate 230 to the top plate 240 via the manifold 280. Fluid may traverse channel(s) in the top plate 250. Heat may be spread in an analogous manner to the plates 210 and 230. Heat is also transferred to the heat exchange surfaces (fins) 240 and removed by the gaseous or other coolant flowing past the surfaces 220 and 240. As the fluid travels through the plates 210, 230, and 250 and the heat is rejected to the gaseous coolant through the heat exchange surfaces 220 and 240, the vapor in the coolant condenses and a saturated fluid, or slightly sub-cooled fluid, leaves the top plate 250. The coolant may then flow back through the manifold 260 to the pump(s) 270. Although the fluid flow is described as traversing the plates 210, 230, and 250 in series, the heat sink assembly 200 might be configured so that the plates 210, 230, and 250 are traversed in parallel.

The heat sink assembly 200 may have a variety of advantages. Use of the micro-channel heat sinks 100/100' may improve the efficiency of heat transfer from the device being cooled. Boiling heat transfer utilizes the latent heat of vaporization of a fluid. This is the energy that is required to be absorbed by the fluid for it to change phase and become vapor. This phase chase may occur without a change in temperature of the fluid/vapor. An advantage of using boiling heat transfer for cooling applications may include providing a uniform temperature at which to provide the cooling. The temperature may be uniform with regards to the boiling surface as well as a changing heat input. Thus, the component to be cooled by the assembly may have a more uniform temperature. Further, as the latent heat of vaporization of a fluid is high in comparison to a change in temperature of the fluid, a greater amount of heat might be able to be dissipated using micro-channel heat sinks.

Further, it is noted that in the embodiment shown, general flow direction of fluid is counter to the direction of the gaseous coolant flow through the heat exchange surfaces 220/240. For example, the coolant may flow through plates 210, and 250 generally in the liquid flow direction shown, while the coolant generally flows through the plate 230 in the opposite direction. Directing the flow of the coolant through the plates 210, 230, and 250 generally opposite to the gaseous coolant flow direction may improve the efficiency of the heat sink assembly 200. Gaseous coolant, such as air, that is downstream has already traversed a warm portion of the plates 210/230/250 and heat exchange surfaces 220/240. Consequently, this air is warmer and less able to remove heat from the heat sink assembly 200. As a result, the portion of the heat sink assembly 200 to the right in FIGS. 6-7 may be desired to have improved efficiency. This improvement in efficiency relative to the upstream portion of the heat sink assembly 200 may be achieved by ensuring the fluid enters the downstream portion of the plates 210/230/250 and heat exchange surfaces 220/240 first. This configuration may be seen in the drawings. The general flow of fluid from the pump 270 is in a direction opposite to the flow of air. Thus, the fluid generally enters the bottom plate 210 from the manifold 280 at the far right in FIG. 7 and exits the top plate 250, returning to the pump 270 via the manifold 260 to the left.

In addition, the heat exchange surface(s)/fins 220 and 240 are each between two plates 210 and 230 and 230 and 250, respectively. Use of two plates doubles the contact surface area for heat transfer between the fluids and heat exchange surfaces 220/240. Further, each fin of the heat exchange surface(s) 220/240 is attached to two of the plates 210, 230, and 250 at both its top and bottom. This allows the heat to be transferred into the fins from both ends of the fins. Heat transfer from both ends, effectively reduces the fin length for each conduction heat transfer path. This improves the fin efficiency, which is inversely related to the fin length. Stated differently, cooling at the ends of fins is avoided because both of the fin ends are all attached to a plate. Further, one or more of the plates 210, 230, and 250 may include one or more dummy channels. A dummy channel is a channel within the plate 210, 230, and/or 250 which does not carry coolant. Because no fluid traverses these channels, they are termed "dummy" channels. Such channels may be filled with vacuum or a gas. In some embodiments, the dummy channels surround a portion of the plate 210, 230, and/or 250. For example, the inlet from the pump 270 through the plate 210 to the two-phase heat sink 100" may be thermally insulated from the hotter portion of the plate 210 carrying fluid received from the two-phase heat sink 100". Consequently, a portion of the plate 210, 230, and/or 250 may be thermally insulated from a portion of the hottest portion of the coolant. As a result, the ability of the plates 210, 230, and/or 250 may be improved.

In addition, the location of the pump 270 may be selected to improve the cooling power of the heat sink assembly 200. In particular, the flow of the gaseous coolant in the heat sink assembly 200 is not exactly horizontal in FIGS. 6-7. Instead, as sown in FIG. 7, there is some vertical component to the gaseous coolant flow direction. The specifics of the gaseous coolant flow direction depend at least in part on the apparatus used to drive the gaseous coolant past the heat exchange surfaces 220/240. The pump 270 is located in a region of the heat sink assembly 200 where the flow rate of gaseous coolant is relatively low. The higher rate of gaseous coolant flow, and thus cooling power, is directed through the heat exchange surface(s) 220 and 240. Consequently, the cooling power of the heat exchange surface(s) 220 and 240 and gaseous coolant flow may be more efficiently used.

Figure 8:
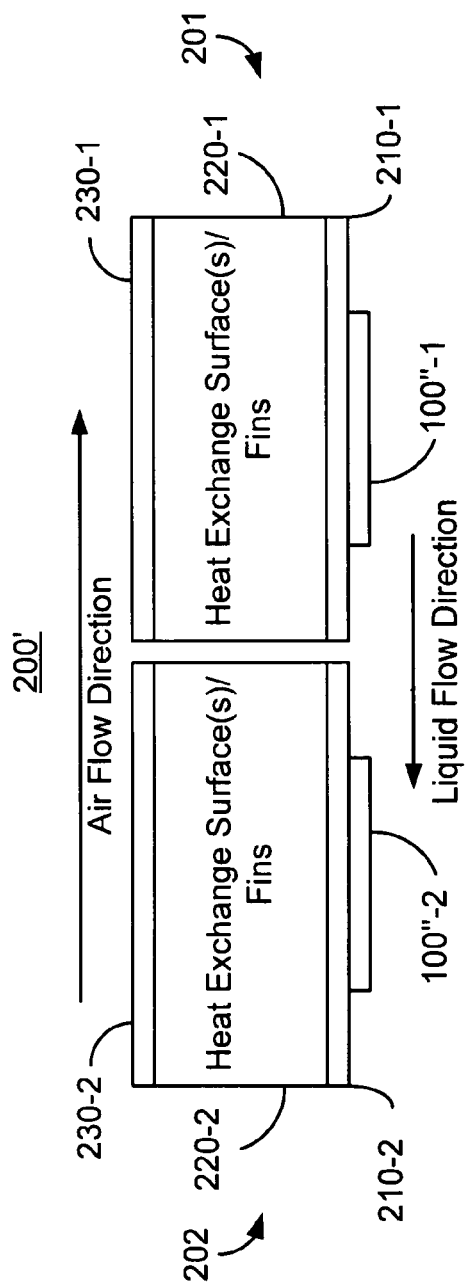
FIGS. 8-9 are block diagrams of another exemplary embodiment of a heat sink assembly that may be used with a two-phase micro-channel heat sink.
Figure 9:
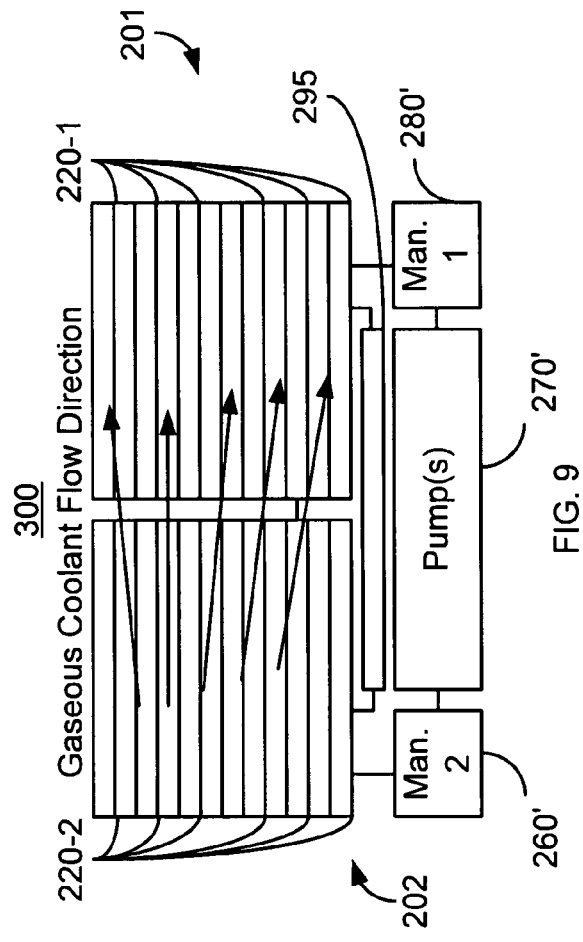

FIGS. 8-9 are top and side views of another exemplary embodiment of a heat sink assembly 200' that may be used with a two-phase micro-channel heat sink 100 or 100'. The heat sink assembly 200' includes heat sink sub-assemblies 201 and 202, each of which is analogous to a portion of the heat sink assembly 200 depicted in FIGS. 6-7. Thus, sub-assembly 201 includes components 210-1, 220-1 and 230-1 that are analogous to components 210, 220, and 230, respectively. Sub-assembly 202 includes components 210-2, 220-2, and 230-2 that are analogous to components 210, 220, and 230, respectively. In addition, the heat sink assembly 200' includes at least a first manifold 280', at least a second manifold 280', and at least one pump 270'. Referring back to FIGS. 8-9, for clarity, FIGS. 8-9 are not to scale. In some embodiments, some components of the heat sink assembly 200' may be combined or omitted. In addition, other components (not shown) may be provided. In some embodiments, the heat sink assembly 200' may take the place of the condenser 152/152', pump 154/154', connections 156/156' and or ultimate heat sink 158/158' depicted in FIGS. 4-5. In addition, for clarity, the electronic device to which the two-phase heat sink 100" may be thermally connected is not shown. In some embodiments, the two-phase heat sink 100"-1 and 100"-2 includes one or more of the heat sinks 100 and 100'. Thus, the heat sink 100"-1 and 100"-2 may include cross-connect channels in addition to flow micro-channels described above. The micro-channel heat sinks 100"-1 and 100"-2 may thus operate as a single-phase (i.e. liquid) heat sink or as two-phase heat sinks, as described above.

For simplicity, one pump 270' is shown. However, in other embodiments, multiple pumps might be used. Also for simplicity, two sub-assemblies 201 and 202 are shown in FIGS. 8-9. However, another number of sub-assemblies may be used. For example, a single sub-assembly or three or more sub-assemblies might be employed. In addition, the sub-assemblies are shown as being identical in FIGS. 8-9. However, in some embodiments, portions or all of the sub-assemblies may differ. For example, the plates 210-1 and 230-1 of the sub-assembly 201 may be larger than those 210-2 and 230-2 of sub-assembly 202. The two-phase heat sink 100"-1 may also be different from the two-phase heat sink 100"-2. For each sub-assembly 201 and 202, two plates 210-1/210-2 and 230-1/230-3 having fins 230-1/230-2 coupled there between are used. However, in another embodiment, another number of plates which may, or may not, utilize the same configuration of fins might also be employed. The assembly may be coupled with electrical component(s) desired to be cooled. Such electrical components are not shown in FIGS. 8-9. For example, in some embodiments, the assemblies might be used to cool a graphics card or analogous component(s).

Each sub-assembly 201 and 202 includes a two-phase heat sink, 100"-1 and 100"-2 that may be a micro-channel heat sink, a bottom plate 210-1/210-2, a top plate 230-1/230-2, fins/heat exchange surfaces 220-1/220-2, and at least one manifold 280' or 260'. Heat is exchanged from the device being cooled to the micro-channel heat sink 100"-1 and 100"-2. Heat from the micro-channel heat sink 100"-1/100"-2 is exchanged with the bottom plate 210-1/210-2 and top plate 230-1/230-2 of each sub-assembly 201 and 202, respectively. Heat from the bottom plate 210-1/210-2 and top plate 230-1/230-2 is also provided to the stream of gaseous coolant (e.g. air) through the use of two cooling plates 210-1/210-2 and 230-1/230-2 with internal cooling passages/heat exchange surfaces (i.e. fins) 220-1/220-2. In another embodiment, a coolant other than a gaseous coolant might be used. However, the coolant flowing through the heat exchange surfaces 220-1/220-2 is separate from the fluid flowing through the two-phase heat sink 100". Thus, heat from the component being cooled may be removed from the heat sink assembly 200'.

In general, fluid that may be saturated enters the micro-channel heat sink 100"-1. In one embodiment, fluid, or coolant, flows from the pump 270', through manifold 280' to the bottom plate 210-1, then to the micro-channel heat sink 100"-1. The fluid/coolant may include a single phase fluid (e.g. cooled fluid prior to entering a micro-channel heat sink 100"-1/100"-2) as well as a two-phase fluid-gas combination (e.g. after heat exchange in the micro-channel heat sink 100"-1/100"-2 has caused some portion of the fluid to boil). The fluid flows through the micro sized passages in the heat sink 100"-1/100"-2 and absorbs heat. The fluid may change phase (boiling) if sufficient heat is exchanged and/or a sufficiently low flow is used. The two-phase fluid exits the micro-channel heat sink 100″-1 and goes into the bottom cooling plate 210-1. In the bottom plate 210-1, one or more fluid channels are arranged in a pattern, such as a serpentine pattern. The channels may cover the area of the bottom plate 210-1. This allows the hot fluid to spread the heat over the area of the bottom plate 210-1. In one embodiment, heat may be spread substantially over the entire bottom plate 210-1, creating a larger platform area than the die (micro-channel heat sink 100″-1) size to transfer heat to the gaseous coolant. The heat conducts up into the heat exchange surface(s) 220-1, then to the gaseous coolant flowing through the assembly 200′. From the bottom plate 210-1, the fluid travels to the top cooling plate 230-1. In one embodiment, fluid travels from the bottom plate 210-1 to the top plate 230-1 via the manifold 280′. Fluid may traverse channel(s) in the top plate 230-1 in an analogous manner to the bottom plate 210-1. Heat may be spread in an analogous manner to the bottom plate 210-1. Although the fluid flow is described as traversing the sub-assembly 201 in series, the heat sink assembly 200′ might be configured so that portions of the sub-assembly 201 is traversed in parallel.

As the fluid travels through the top plate 230-1 and bottom cooling plate 210-1 and the heat is rejected to the gaseous coolant via the fins 220-1, at least a portion of the vapor condenses. A saturated fluid, or slightly sub-cooled fluid, leaves the top plate 230-1. The fluid flows from the top plate 230-1 of the sub-assembly 201 to the bottom plate 210-2 of the sub-assembly 202. In one embodiment, the manifold 280′ conducts fluid from the top plate to a cross-over tube 295 or other mechanism for providing fluid from the sub-assembly 201 to the sub-assembly 202. In another embodiment, the fluid may be passed to another pump (not separately shown), which then pumps the fluid to the sub-assembly 202. The fluid then travels from the bottom plate 210-2 into the inlet of the micro-channel heat sink 100″-2. Here the fluid may follow an analogous (including identical) path as in the sub-assembly 201. The sub-assembly 202 functions in a similar manner to the sub-assembly 201. The fluid can conduct heat down into the air heat exchange fins 220-2 as well as to a cover (not shown in FIGS. 8-9) to reject heat to the areas right outside of the component. Upon exiting the top plate 230-2, the fluid is then sent back to the pump 270′, for example via the manifold 260′. Although the fluid flow is described as traversing the sub-assembly 202 in series, the heat sink assembly 200′ might be configured so that portions of the sub-assembly 202 are traversed in parallel. Further, although the fluid flow is described as traversing the sub-assemblies 201 and 202 in series, the heat sink assembly 200′ might be configured so that the sub-assemblies 201 and 202 are traversed in parallel.

The heat sink assembly 200′ assembly may have a variety of advantages analogous to those described above for the heat sink 200. For example, it is noted that the general flow direction of fluid is counter to the direction of gaseous coolant flow through the fins 220-2 and 220-1. Directing the flow of the fluid counter to the gaseous coolant flow direction may improve the efficiency of the heat sink assembly 200′. Gaseous coolant, such as air, that is downstream has already traversed the sub-assembly 202 before reaching sub-assembly 201. Consequently, this gaseous coolant is warmer and less able to remove heat from the sub-assembly 201. As a result, the sub-assembly 201 may be desired to have improved efficiency. This improvement in efficiency relative to the upstream sub-assembly 202 may be achieved by ensuring the fluid enters the downstream sub-assembly 201 first. This configuration may be seen in FIGS. 8-9. The general flow of fluid from the pump is in a direction opposite to the flow of air. Thus, the fluid generally enters the bottom plate 210-1 from the far right, traverses the bottom plate 210-1 and top plate 230-1, and then is provided to the sub-assembly 202.

For example, the component that is downstream is cooled by the sub-assembly 201. This downstream component typically is desired to have a better performing heat sink as the gaseous coolant temperature at the sub-assembly 201 is higher than the sub-assembly 202. The higher gaseous coolant temperature is due to the heating of the air while passing through the sub-assembly 202. The cooling fluid enters the downstream heat sink sub-assembly 201 first, creating a counter-flow heat exchanger. This may provide equal and adjustable amount of cooling to the individual processors independently by design. The fluid is cooled in the sub-assembly 201 prior to entering sub-assembly 202. However, this cooling may still result in a fluid that is warmer than fluid directly from the pump 270′. The down-stream sub-assembly thus uses fluid that, upon entry, is cooler than the upstream. This may at least partially counteract the effect of the warmer air flow. Thus, the heat sink assembly's flow of fluid counter to the air flow may improve cooling efficiency of the heat sink assembly 200′.

As discussed above, the location of the pump 270′ may be selected to improve the efficiency of the heat sink assembly. As discussed above, the gaseous coolant/air flow direction is generally from the sub-assembly 202 to the sub-assembly 201 as shown in FIGS. 8-9. However, in some embodiments, the gaseous coolant/air flow may have some transverse component to its direction of motion. As can be seen in FIG. 9, the air flow does not move exactly left to right. For example, the component (not shown in FIGS. 8-9) that drives the air flow may drive the air in direction(s) that are not completely parallel to the passages formed by the fins 220-1 and 220-2. Further, the heat sink assembly 200′ may have a geometry that restricts gaseous coolant/air flow in some regions. As a result, there may exist a region in the heat sink assembly 200′ of lower gaseous coolant/air flow. Stated differently, a dead zone may exist in the gaseous coolant/air flow. The pump 270′ is located in the heat sink assembly's dead zone. Because the pump 270′, which does not require a direct exchange of heat to the gaseous coolant/air flow to function as desired, is located in this dead zone, regions of the heat sink assembly 200′ which do maintain an airflow may remain available for use in exchanging heat. Consequently, efficiency of the heat sink assembly 200′ may be improved.

Figure 10:
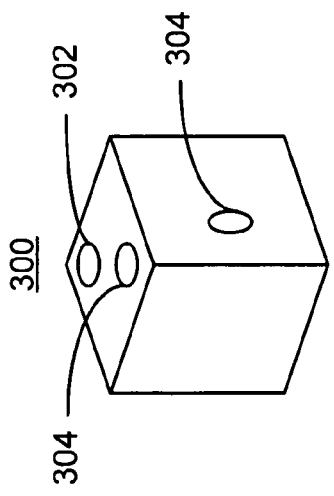
FIG. 10 is an exemplary embodiment of a manifold.

Further, use of manifolds may also improve the heat sink assembly. The heat sink sub-assemblies may utilize manifolds 260′ and 280′ for directing fluid entering and leaving the top and bottom plates, as well as entering and leaving the sub-assembly 200-1 or 200-2. For example, FIG. 10 depicts one exemplary embodiment of a manifold 300. The manifold 300 might be used for the manifold 260, 280, 260′, and/or 280′. The manifold 300 is solid, for example formed from a copper block having holes 302 and 304 drilled therein to control fluid flow. The configuration and number of apertures 302 and 304 may depend upon the functions for which the manifold 300 is desired. In some embodiments, a manifold directs 300 fluid entering a sub-assembly 201 to the bottom plate 210-1, directs fluid from the bottom plate 210-1 to the top plate 230-1 and directs fluid from the top plate 230-1 to a cross-over tube 295 to another sub-assembly or back to the pump. The manifold 300 may be used in lieu of tubing to direct the fluid flow. As such issues such as leakage, lack of stability, and increasing the footprint of the system, may be avoided. Further, because the manifold 300 may be a large copper or other metallic block, the manifold 300 may provide a larger footprint to solder to the bottom plate 210-1/210-2 or remaining portions of the sub-assembly. Thus, the manifold may also improve stability, reduce leakage, and otherwise improve the performance of the heat sink assembly 200/200'.

Figure 11:
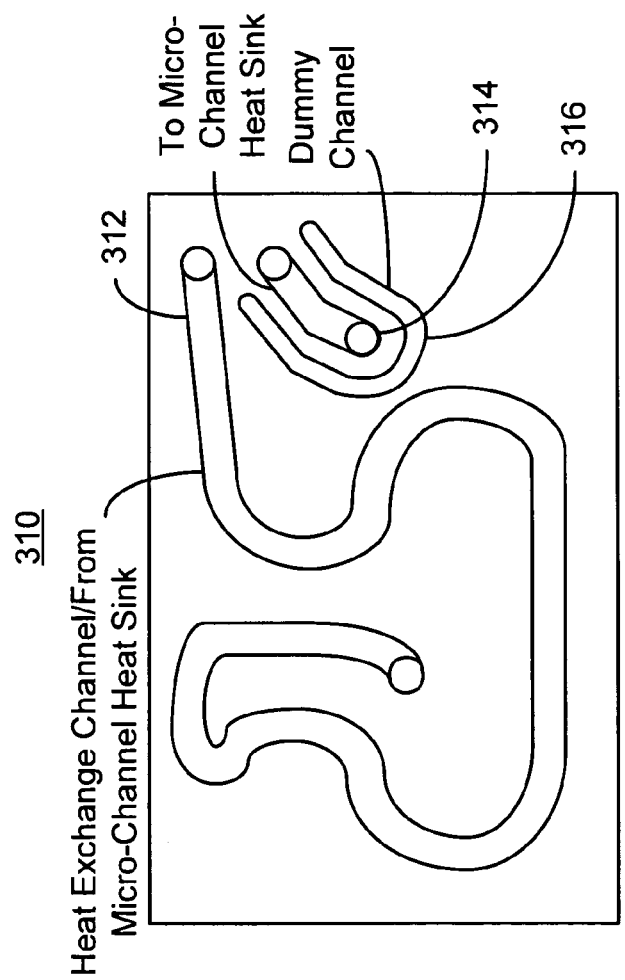
FIG. 11 depicts an exemplary embodiment of a portion of a plate for use in a heat sink assembly.

As described for the heat sink assembly 200, the heat sink assembly 200' may also have improved cooling efficiency through the use of dummy channels. FIG. 11 depicts one embodiment of a portion of a bottom plate 300 of a heat sink assembly 200 or 200'. For clarity, FIG. 11 is not to scale. The bottom plate 310 channels 312 and 314 as well as a dummy channel 316. The specific configuration of the channels 312 and 314 and dummy channel 316 may vary. Further, another number of channels 312 and 314 and/or additional dummy channels 316 may be provided. In one embodiment, the channels 312, 314, and 316 are formed by grooves in a first sub-plate. A second sub-plate, which may have matching or other grooves or may be flat, would be coupled with the first sub-plate to enclose the channels 312, 314, and 316, forming the plate 310. Because the plate 310 is a bottom plate, the channel 314 is to the two-phase heat sink 100"/100"-1/100"-2, while the channel 312 is from the two-phase heat sink 100"/100"-1/100"-2.

The channels 312 and 314 carry the coolant through the plate 310, allowing the coolant to exchange heat to the plate 310. The dummy channel 316 may be used to insulate fluid entering the micro-channel heat sink. Stated differently the dummy channel 316 may be used to thermally insulate a portion of the plate 310. In the embodiment shown, the portion of the plate 310 thermally insulated includes the channel 314 therein. In one embodiment, the dummy channel 316 is formed by grooves in a bottom sub-plate of the bottom plate 310/210/210-1/210-2. When a cover is provided on the bottom sub-plate, an air-filled dummy channel 316 is formed. Alternatively, the cover could be provided in another atmosphere and sealed, or the dummy channel 316 might be filled another way. In another embodiment, the dummy channel 316 may have a vacuum therein. Fluid enters the micro-channel heat sink 100"/100"-1/100"-2 from the bottom plate 310/210/210-1/210-2. This coolant is from the pump 270/270', and may have completed a circuit through the heat sink assembly 200/200'. The fluid is thus comparatively cold. Fluid leaving the two-phase heat sink 100"/100"-1/100"-2 traverses the bottom plate 310/210/210-1/210-2. Fluid from the two-phase heat sink 100"/100"-1/100"-2 is relatively hot, having just received heat from the two-phase heat sink 100"/100"-1/100"-2. The dummy channels 316 may be filled with air, other thermal insulator(s), or vacuum. As a result, the dummy channels 316 are thermally insulative. Because the dummy channel 316 is insulative in nature, the dummy channel 316 may assist in thermally isolating the channel 314 into the two-phase heat sink 100"/100"-1/100"-2. Consequently, fluid to the two-phase heat sink 100"/100"-1/100"-2 may remain cooler. The efficiency of the two-phase heat sink 100"/100"-1/100"-2 may thereby be improved.

Figure 12:
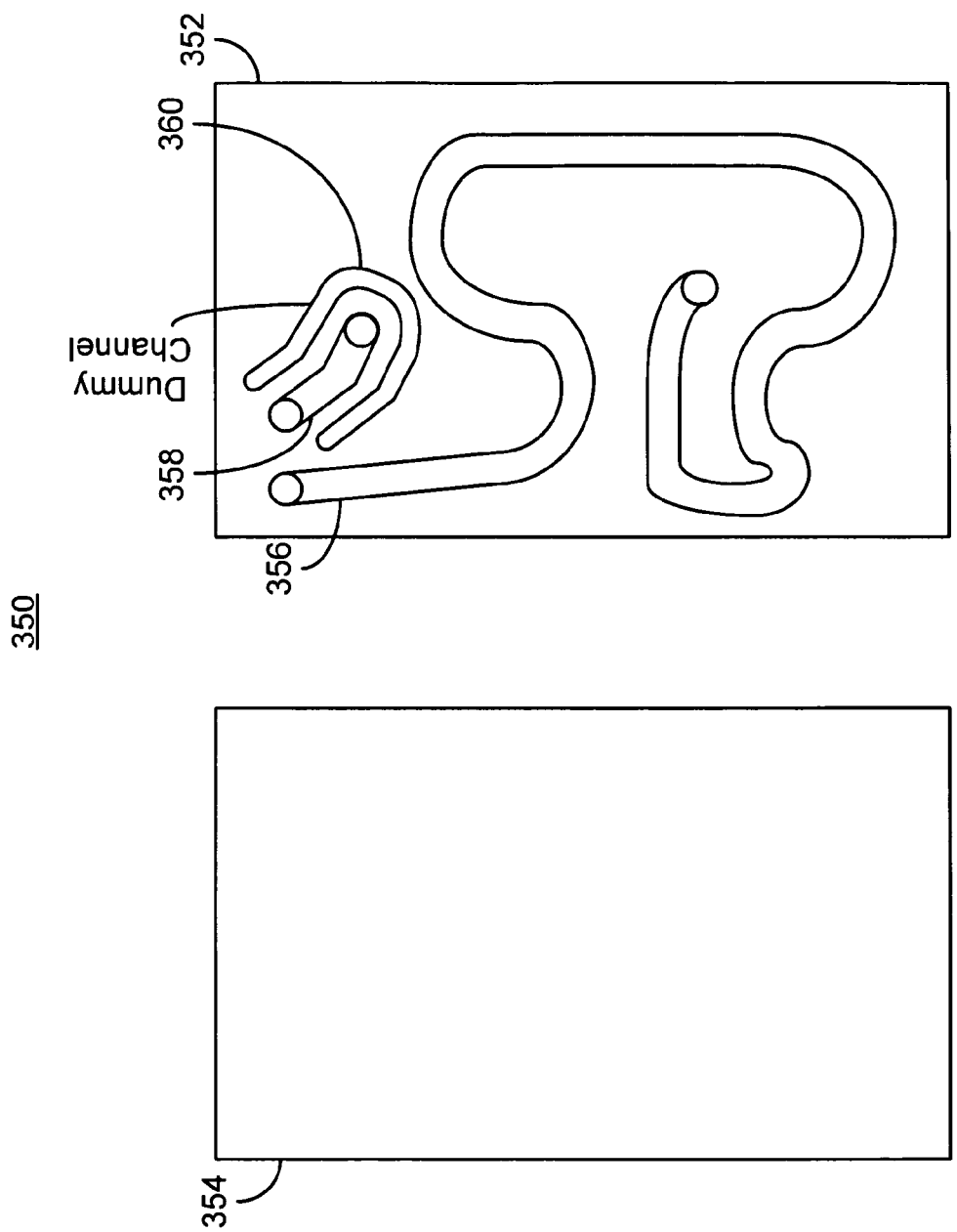
FIG. 12 depicts another exemplary embodiment of a plate for use in a heat sink assembly.

FIG. 12 depicts another exemplary embodiment of a plate 350 for use in a heat sink sub-assembly. The plate 350 may be used in the heat sink assembly 200 and/or in the sub-assemblies 201 and 202 depicted in FIGS. 8-9. Thus, pump(s), manifold(s), cross-over tubes and other components are not shown.

Referring back to FIG. 12, the plate 350 may be a top plate 230-1/230-2 or a bottom plate 210-1/210-2. The plate 350 includes sub-plates 352 and 354. Thus, grooves 356, 358, and 360 have been formed in the sub-plate 352. Once the sub-plates 352 and 354 are brought together, the grooves 356, 358, and 360 and surface of sub-plate 354 form channels through which coolant flows from the two-phase heat sink (not shown), and optionally other component(s), through the bottom plate 350. Grooves 356, 358, and 360 are shown only in the sub-plate 352. However, in another embodiment, grooves may be formed in both sub-plates 352 and 354 or only in the top sub-plate 354.

The plate 250 may be used in a heat sink assembly or sub-assembly to provide substantially the same benefits as the heat sink assemblies 200 and 200'. Thus, two-phase heat sinks may be incorporated into assemblies that more efficiently cool electronics or other devices.

A method and system for providing and using heat sink assemblies that may be used in connection with two-phase heat sinks has been disclosed. The method and system has been described in accordance with the embodiments shown, and there could be variations to the embodiments, and any variations would be within the spirit and scope of the present invention. For example, the exemplary embodiment can be implemented using hardware, software, a computer readable medium containing program instructions, or a combination thereof. Software written according to the present invention is to be either stored in some form of computer-readable medium such as a memory, a hard disk, or a CD/DVD-ROM and is to be executed by a processor. Accordingly, many modifications may be made by one of ordinary skill in the art without departing from the spirit and scope of the appended claims.

We claim:

1. A heat sink assembly for cooling an electrical device comprising:

a two-phase heat sink thermally coupleable with an electrical device, the two-phase heat sink defining an inlet and an outlet and being capable of supporting boiling of a flow of coolant between the inlet and the outlet;

a first plate fluidly coupled with the two-phase heat sink, the first plate defining a first inlet coupled to the outlet from the two-phase heat sink, a first outlet from the first plate, and a first coolant channel extending therebetween, the first plate also defining a second inlet , a second outlet, and a second coolant channel extending therebetween, the first plate further defining a dummy channel positioned between the corresponding first coolant channel and the second coolant channel;

a second plate fluidly coupled with the first outlet from the first plate and the second inlet to the first plate, such that the coolant flows from the outlet from the outlet from the two-phase heat sink to the first inlet to the first plate, through the first coolant channel in the first plate, from the first outlet from the first plate to the second plate and through the second plate and subsequently to the second inlet to the first plate, through the second coolant channel and out the second outlet from the second coolant channel in the first plate;

a pump fluidly coupled with the two-phase heat sink, the first plate, and the second plate, the pump for driving the coolant through the two-phase heat sink, the first plate, and the second plate;

a heat exchange surface extending between the first plate and the second plate; and wherein a gaseous coolant passes the heat exchange surface substantially in a first direction, the coolant flowing from the inlet to the first plate to the outlet from the first plate in a second direction substantially opposite to the first direction.

2. The heat sink assembly of claim 1 wherein the two-phase heat sink has a first thermal conductivity along a first direction and a second thermal conductivity perpendicular to the plurality of channel walls, the first thermal conductivity being greater than the second thermal conductivity.

3. The heat sink assembly of claim 2 further comprising:
an expansion bladder coupled with the micro-channel heat sink, the expansion bladder for accounting for changes in a volume of the coolant.

4. The heat sink assembly of claim 2 further comprising:
at least one sensor residing in the micro-channel heat sink for monitoring a liquid coolant level of the plurality of channels and providing an output based on the liquid coolant level; and
control logic coupled with the at least one sensor and the pump, the control logic for controlling the pump in response to output from the at least one sensor.

5. The heat sink assembly of claim 4 wherein the at least one sensor includes at least one of a pressure sensor and a temperature sensor.

6. The heat sink assembly of claim 1 wherein the heat exchange surface includes a plurality of fins.

7. The heat sink assembly of claim 1 wherein the two-phase heat sink includes a micro-channel heat sink thermally coupleable with the electrical device, the micro-channel heat sink including a plurality of flow micro-channels defined by a plurality of channels walls, and at least one cross-connect channel, the plurality of flow micro-channels connecting the inlet of the two-phase heatsink with the outlet of the two-phase heatsink and accommodating a flow of coolant between the inlet of the two-phase heatsink and the outlet of the two-phase heatsink, each of the at least one cross-connect channel configured to connect at least a portion of the plurality of flow micro-channels and at least partially equilibrate a pressure field for boiling of the coolant across the portion of the plurality of flow micro-channels.

8. The heat sink assembly of claim 1 wherein the dummy channel thermally insulates a portion of the first coolant channel in the first plate from a portion of the second coolant channel in the first plate.

9. The heat sink assembly of claim 8 wherein the first plate includes a first sub-plate and a second sub-plate, at least one of the first sub-plate and the second sub-plate including a plurality of grooves therein, the first sub-plate and the second sub-plate being configured to meet such that the plurality of grooves form at least one of the coolant channels and the dummy channel.

10. The heat sink assembly of claim 1 wherein the second plate includes at least one corresponding inlet, at least one corresponding outlet, at least one corresponding channel extending between the corresponding at least one inlet and the corresponding at least one outlet, and at least one corresponding dummy channel, the at least one corresponding channel for carrying the coolant through the second plate, the at least one corresponding dummy channel for thermally insulating a portion of the second plate.

11. The heat sink assembly of claim 10 wherein the second plate includes a first sub-plate and a second sub-plate, at least one of the first sub-plate and the second sub-plate of the second plate including a plurality of grooves therein, the first sub-plate and the second sub-plate of the second plate being configured to meet such that the plurality of grooves form the at least one corresponding channel and the at least one corresponding dummy channel.

12. The heat sink assembly of claim 1 further comprising:
at least one manifold having at least one hole therein, the at least one manifold for at least one of fluidly coupling the two-phase heat sink with the first plate and fluidly coupling the first plate with the second plate.

13. The heat sink assembly of claim 1 further comprising:
a third plate coupled with the second plate, the coolant flowing from the second plate to the third plate;
a plurality of fins between the second plate and the third plate, the gaseous coolant flowing between the plurality of fins substantially in the first direction.

14. A heat sink assembly according to claim 1, wherein the at least one dummy channel for is configured to insulate a corresponding portion of the of the first coolant channel from a corresponding portion of the second coolant channel.

15. The heat sink assembly of claim 14 wherein the first plate includes a first sub-plate and a second sub-plate, at least one of the first sub-plate and the second sub-plate including a plurality of grooves therein, the first sub-plate and the second sub-plate being configured to meet such that the plurality of grooves form the at least one channel and the at least one dummy channel.

16. The heat sink assembly of claim 14 wherein the second plate includes a first sub-plate and a second sub-plate, at least one of the first sub-plate and the second sub-plate including a plurality of grooves therein, the first sub-plate and the second sub-plate being configured to meet such that the plurality of grooves form the at least one channel and the at least one dummy channel.

17. The heat sink assembly of claim 14 further comprising:
at least one manifold having at least one hole therein, the at least one manifold for at least one of fluidically coupling the two-phase heat sink with the first plate and fluidically coupling the first plate with the second plate.

18. A heat sink assembly according to claim 1, wherein one or both of the first plate and the second plate constitutes a portion of a condenser configured to receive the coolant from the micro-channel heat sink and to remove heat from the coolant.

* * * * *